United States Patent
Eib et al.

(10) Patent No.: US 7,270,942 B2
(45) Date of Patent: Sep. 18, 2007

(54) OPTIMIZED MIRROR DESIGN FOR OPTICAL DIRECT WRITE

(75) Inventors: Nicholas K. Eib, San Jose, CA (US); Ebo Croffie, Portland, OR (US); Neal Callan, Lake Oswego, OR (US)

(73) Assignee: LSI Corporation, Milpitas, CA (US)

( * ) Notice: Subject to any disclaimer, the term of this patent is extended or adjusted under 35 U.S.C. 154(b) by 236 days.

(21) Appl. No.: 10/825,342

(22) Filed: Apr. 14, 2004

(65) Prior Publication Data

US 2005/0088640 A1    Apr. 28, 2005

Related U.S. Application Data

(60) Provisional application No. 60/513,780, filed on Oct. 22, 2003.

(51) Int. Cl.
*G03B 27/54* (2006.01)
(52) U.S. Cl. .................. 430/322; 430/311; 355/67
(58) Field of Classification Search .............. None
See application file for complete search history.

(56) References Cited

U.S. PATENT DOCUMENTS 5,015,080 A * 5/1991 Cassarly et al. ............ 359/196
2005/0068510 A1 * 3/2005 Bleeker et al. ............. 355/67
2006/0077506 A1 * 4/2006 Sandstrom ................. 359/239

OTHER PUBLICATIONS

Shroff et al., "Optical Analysis of Mirror Based Pattern Generation", Emerging Lithographic Technologies VII, pp. 550-559. © 2003.

* cited by examiner

*Primary Examiner*—John A. McPherson
*Assistant Examiner*—Deborah Chacko-Davis
(74) *Attorney, Agent, or Firm*—Beyer Weaver, LLP

(57) ABSTRACT

The present invention provides an optimized direct write lithography system using optical mirrors. That is, a maskless lithography system is provided. The maskless direct-write lithography system provided uses an array of mirrors configured to operate in a tilting mode, a piston-displacement mode, or both in combination. The controlled mirror array is used as a substitute for the traditional chrome on glass masks. In order to avoid constraining the system to forming edges of patterns aligned with the array of mirrors, grayscale techniques are used for subpixel feature placement. The direct-writing of a pattern portion may rely on a single mirror mode or a combination of modes.

4 Claims, 10 Drawing Sheets

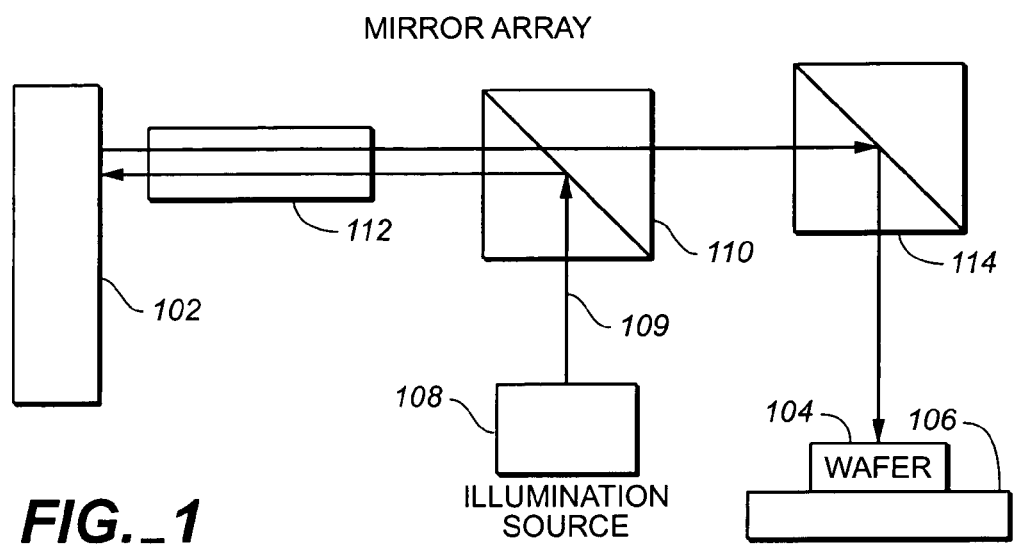
FIG._1
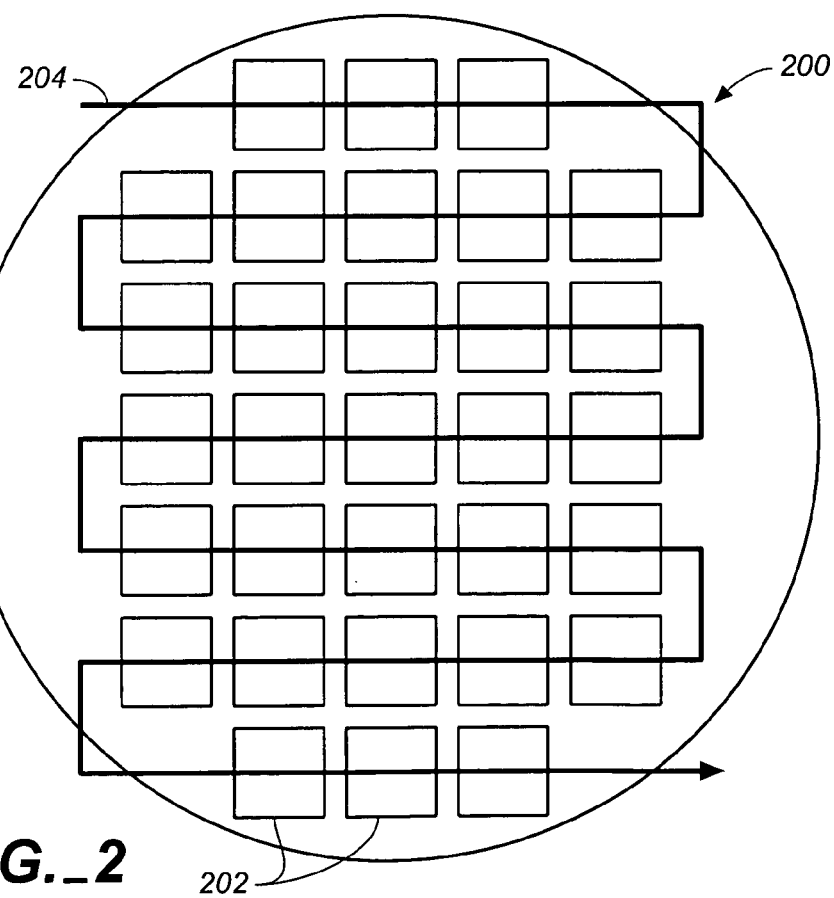
FIG._2

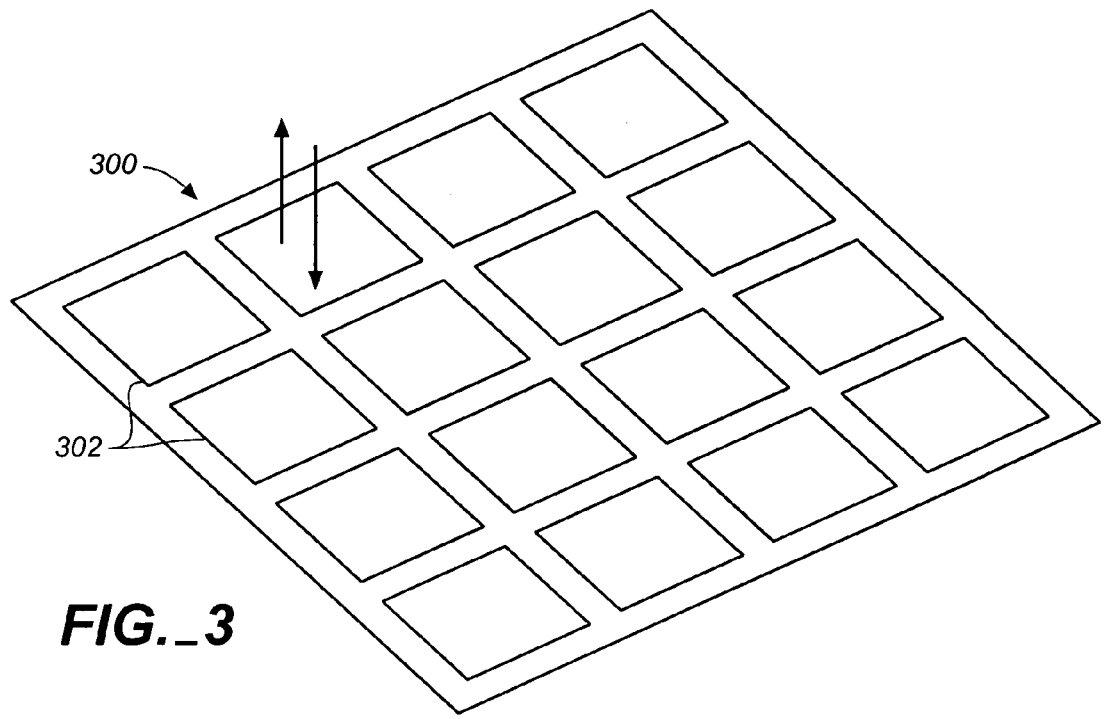
FIG._3
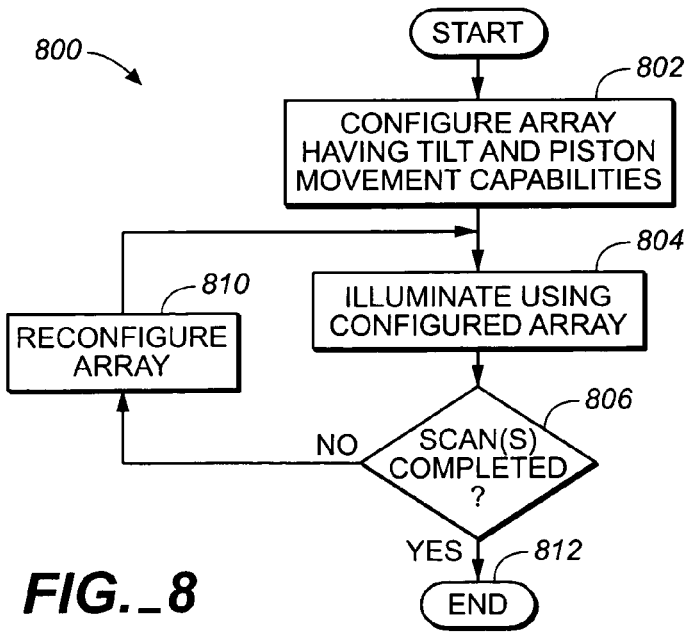
FIG._8

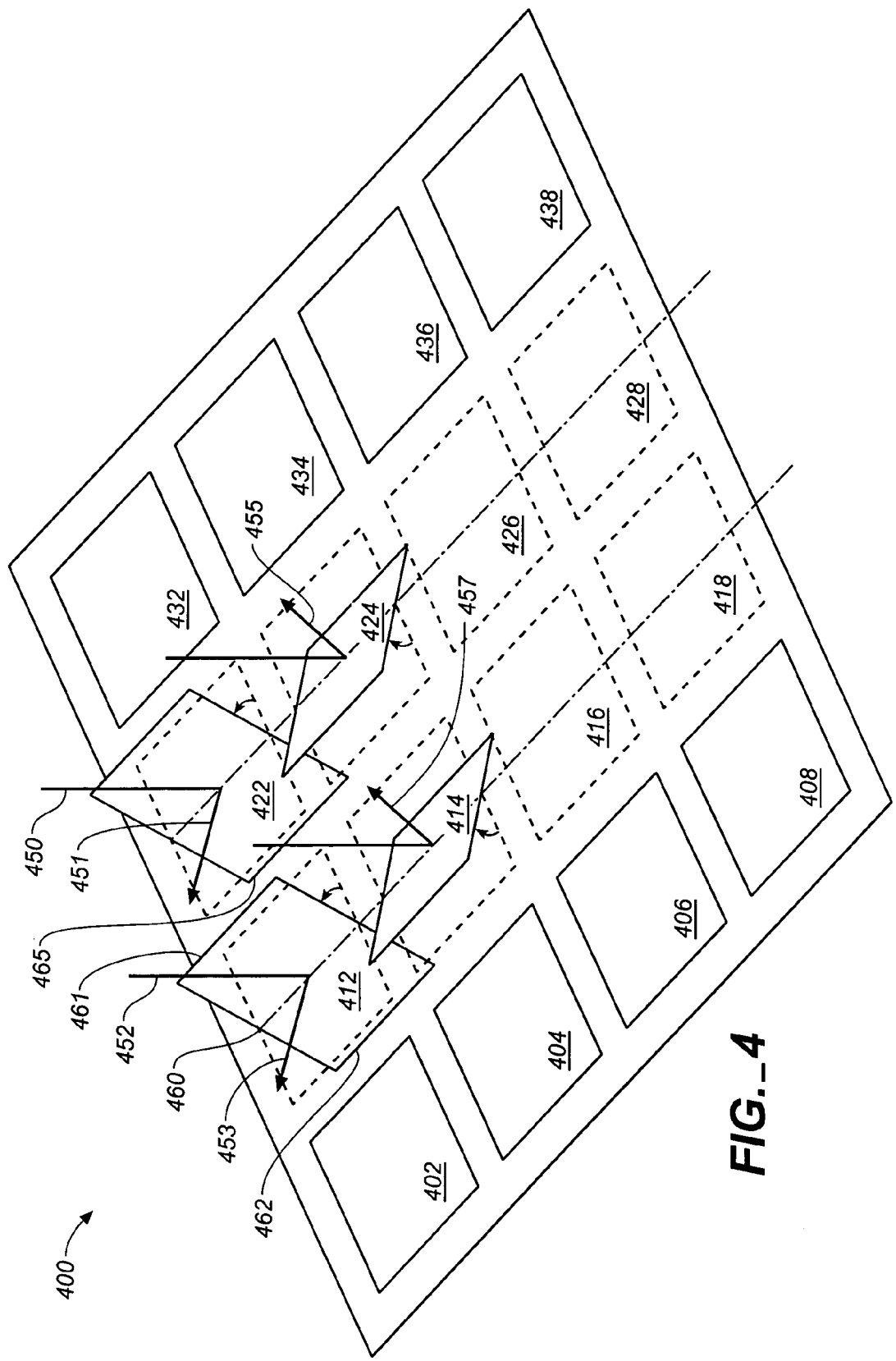
FIG._4

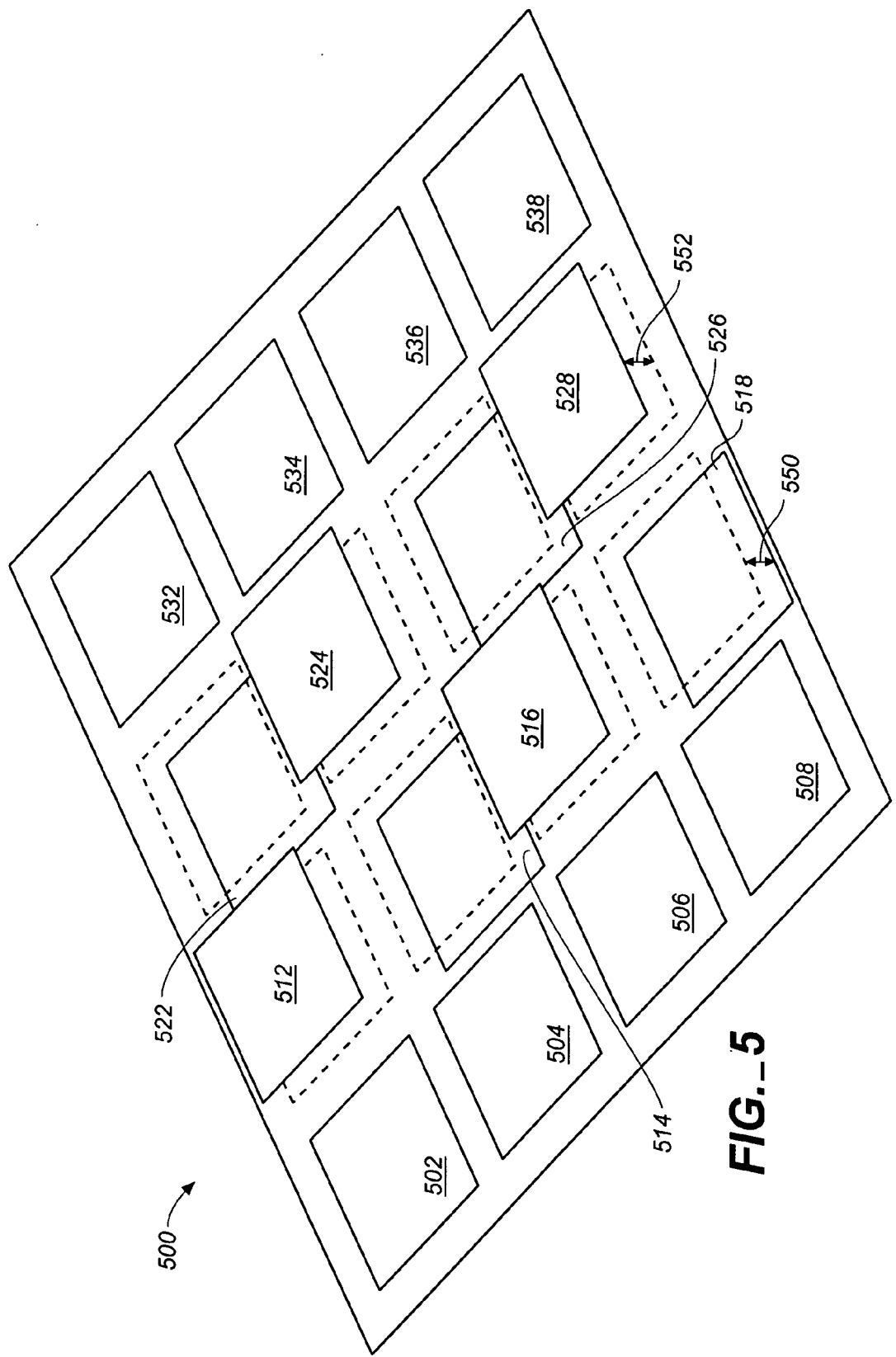
FIG._5

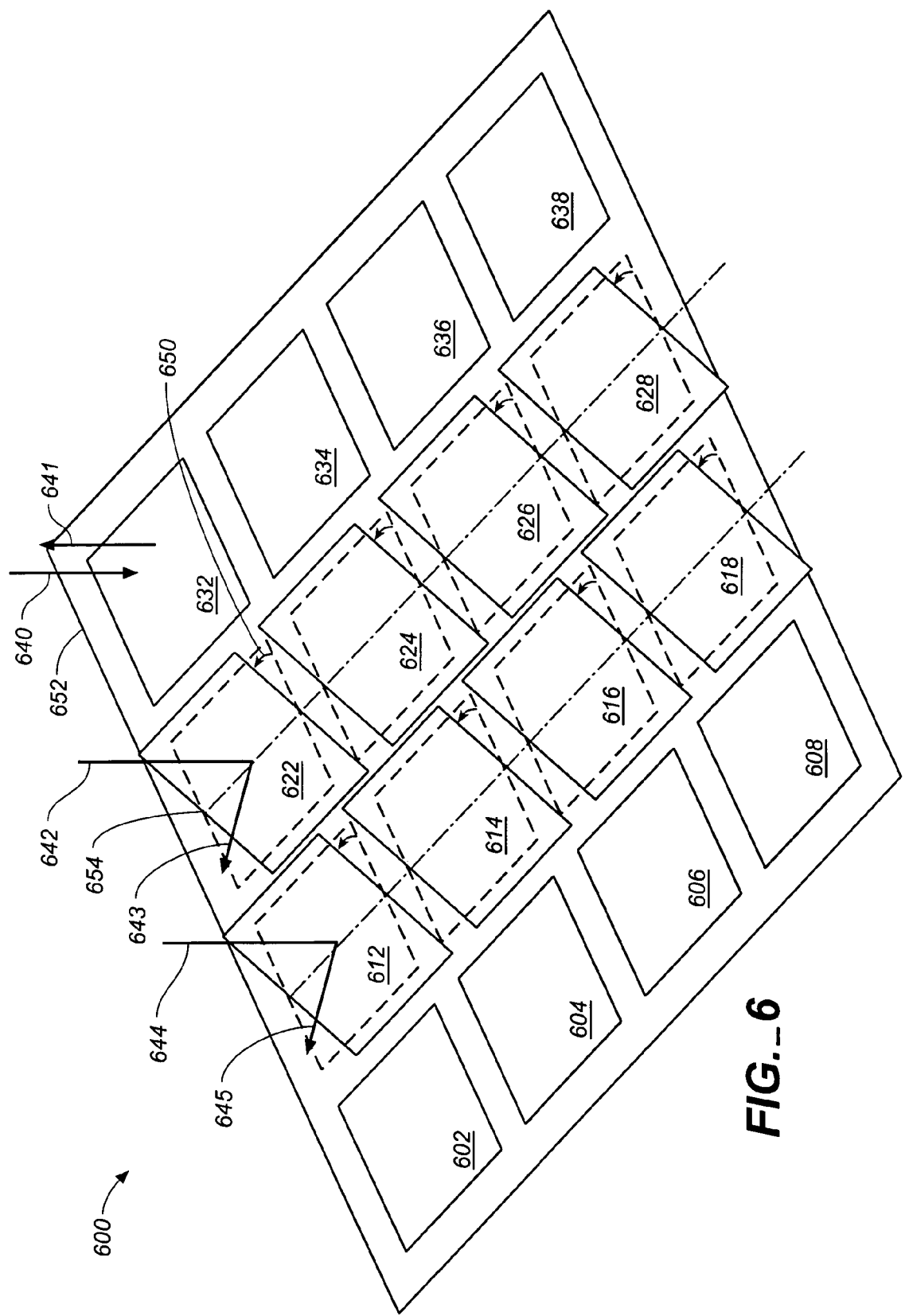
FIG._6

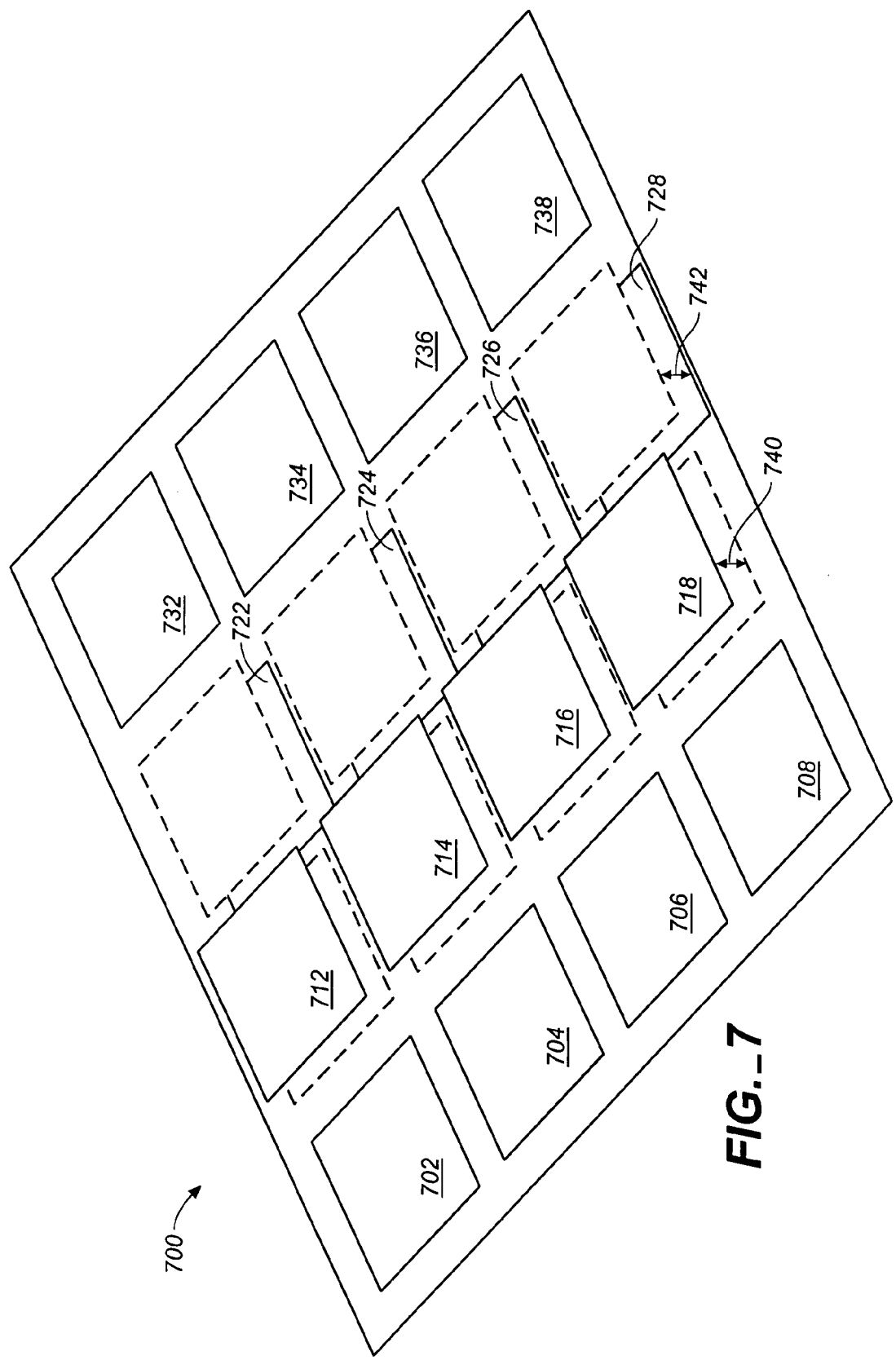
FIG._7

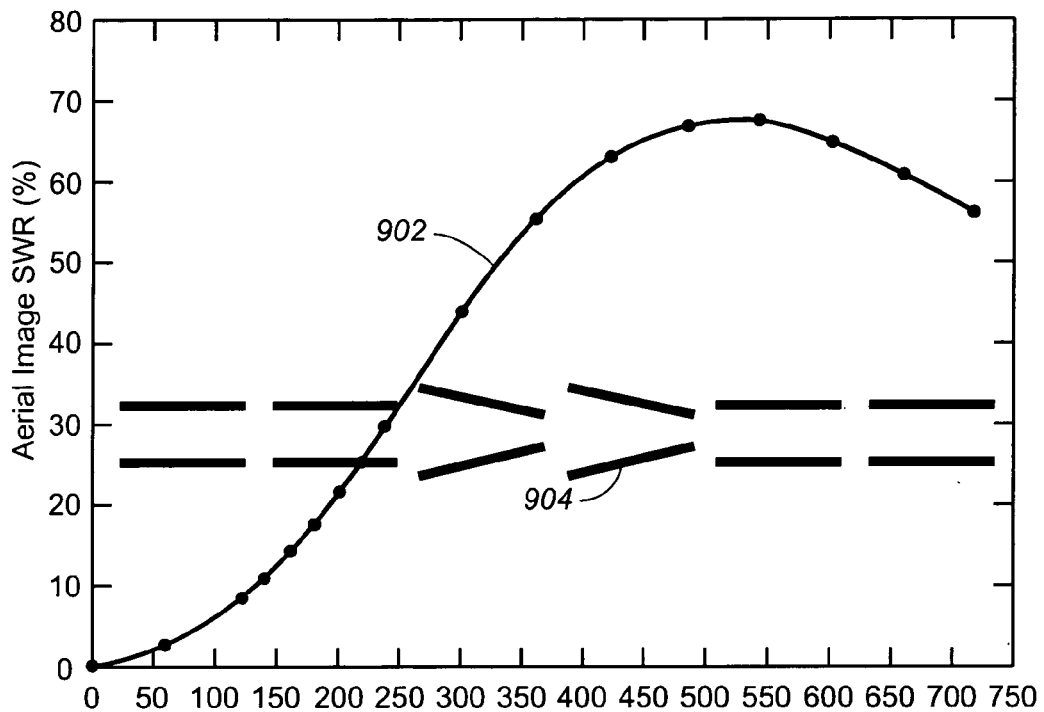
FIG._9A
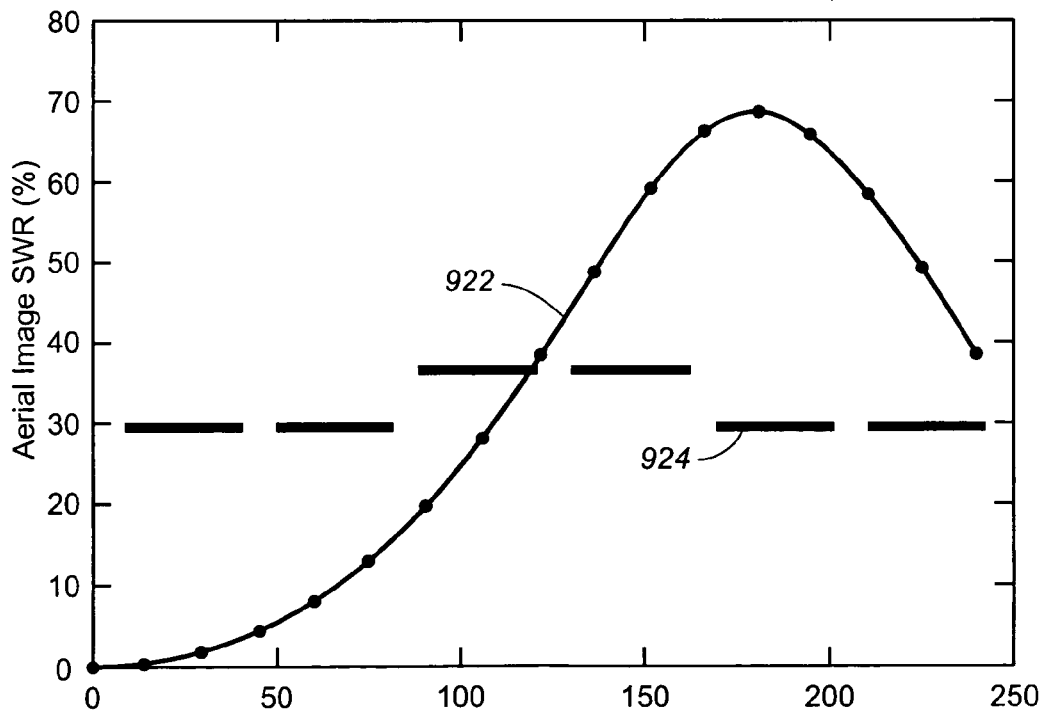
FIG._9B

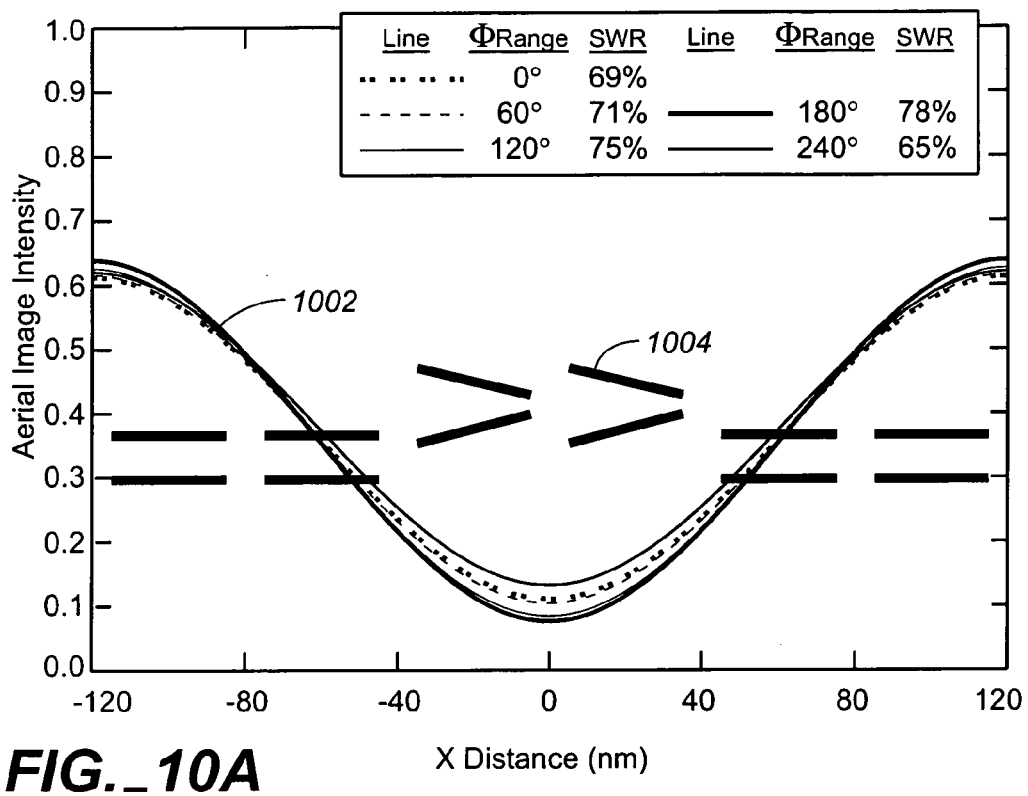
FIG._10A
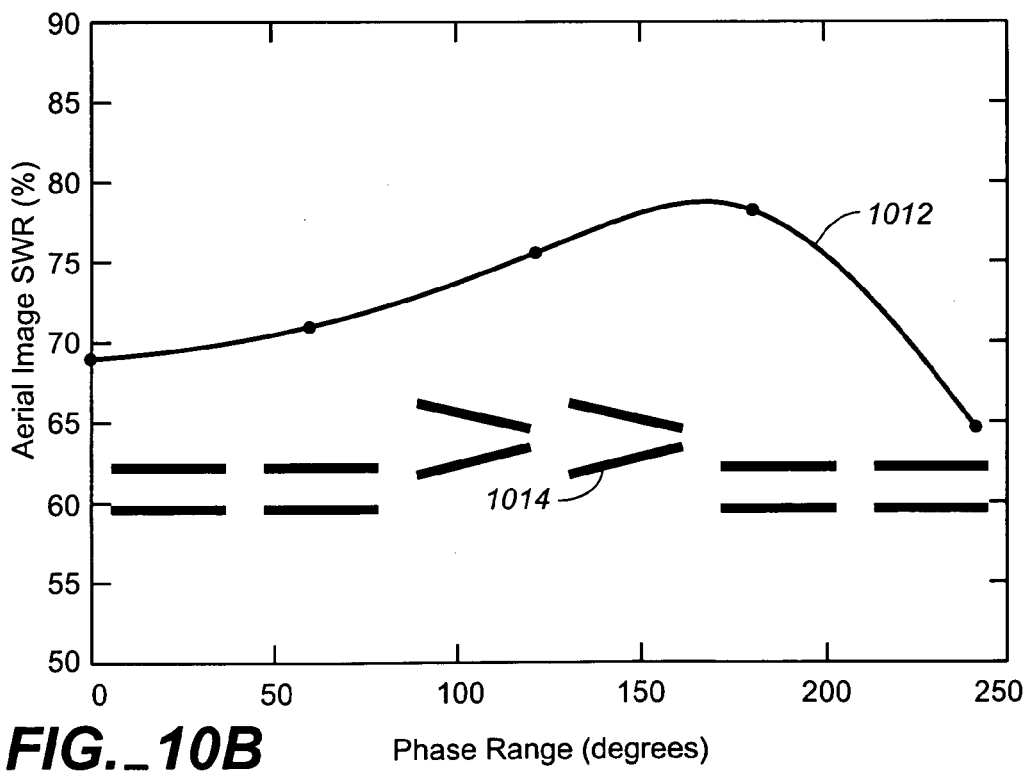
FIG._10B

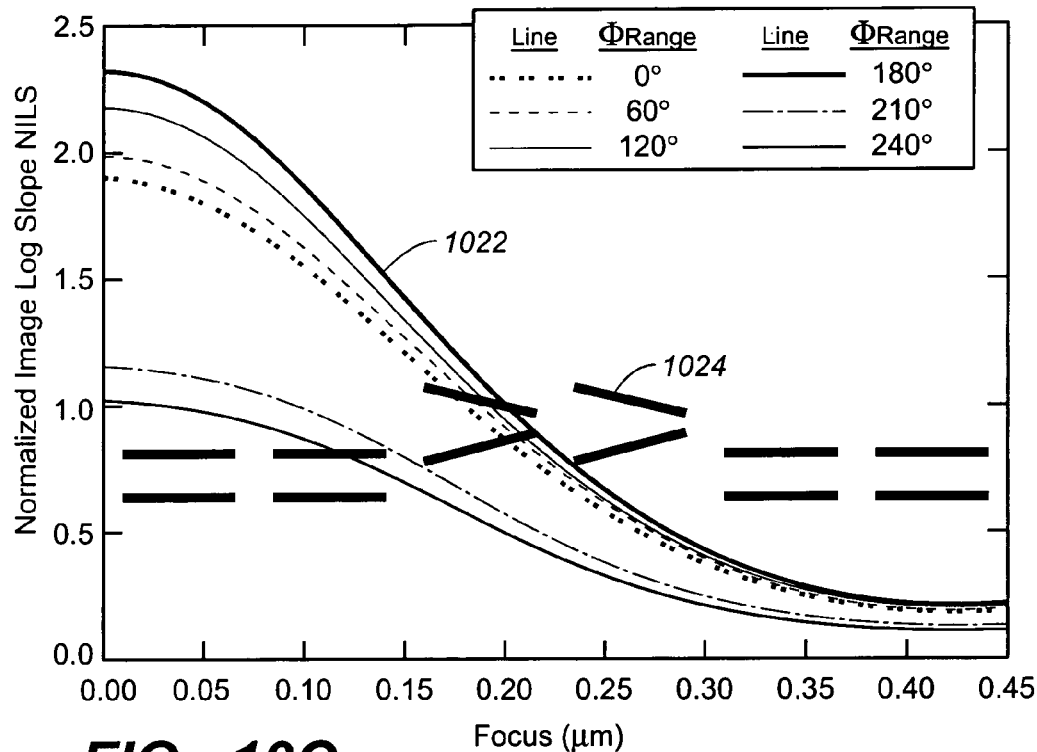
FIG._10C
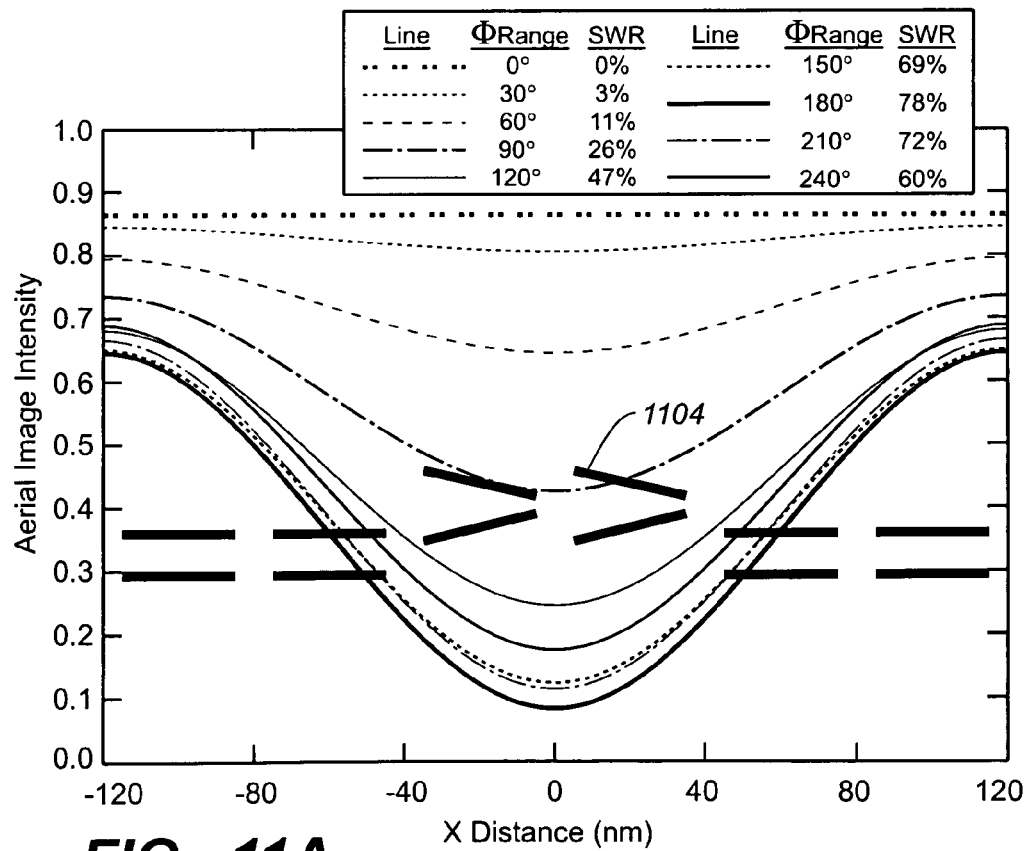
FIG._11A

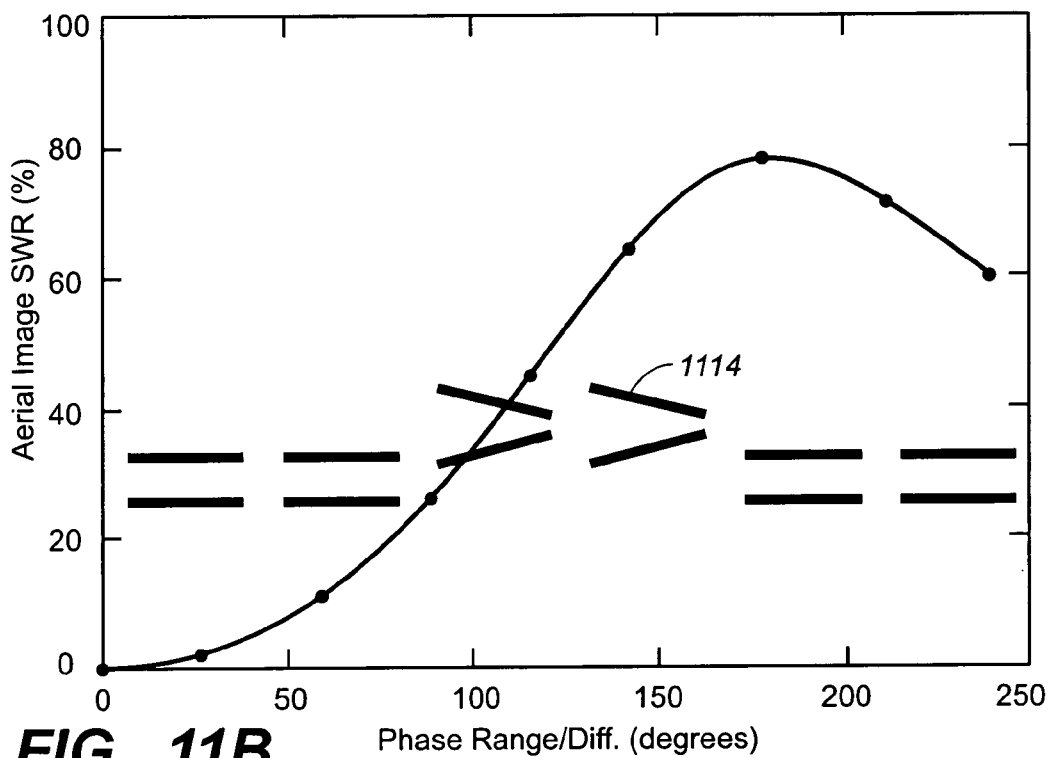
FIG._11B
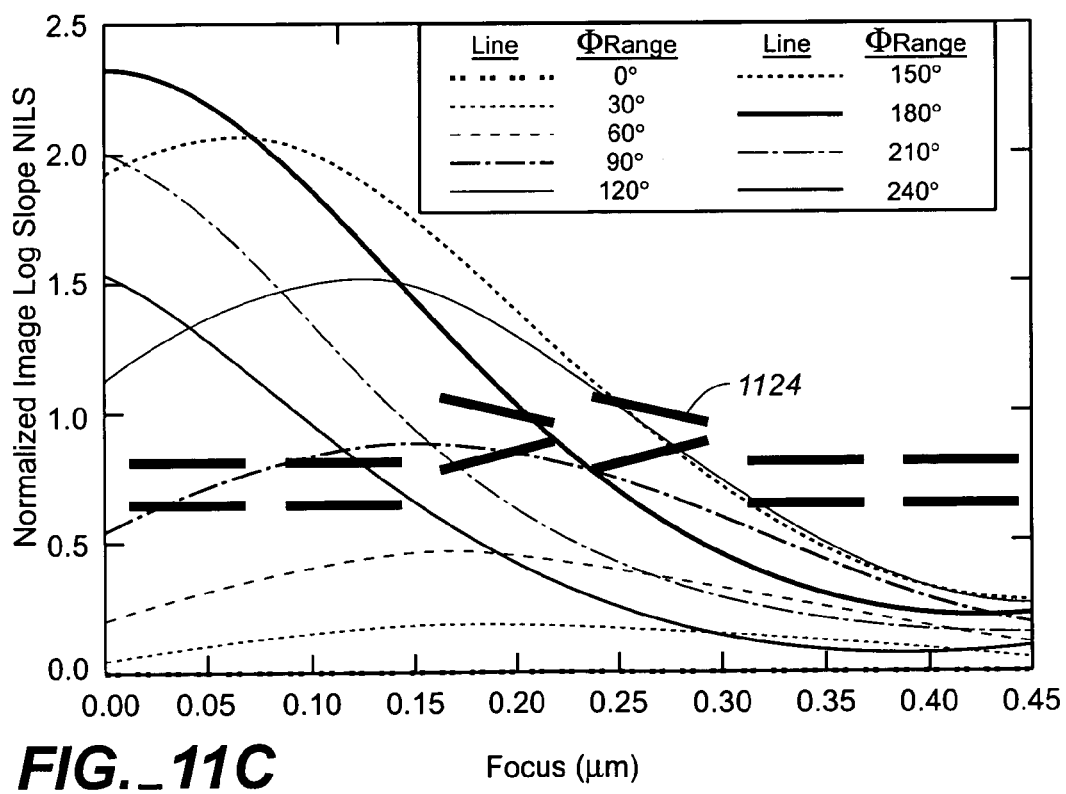
FIG._11C

OPTIMIZED MIRROR DESIGN FOR OPTICAL DIRECT WRITE

CROSS-REFERENCE TO RELATED APPLICATIONS

This application claims priority of U.S. Provisional Patent Application No. 60/513,780, filed 22 Oct. 2003, which application is incorporated herein by reference in its entirety for all purposes.

BACKGROUND OF THE INVENTION

1. Field of the Invention

The present invention relates to methods for forming semiconductor devices. More particularly, the present invention relates to methods for directly writing patterns to create semiconductor devices on semiconductor wafers.

2. Description of the Related Art

Designers and semiconductor device manufacturers constantly strive to develop smaller devices from wafers, recognizing that circuits with smaller features generally produce greater speeds and increased packing density, therefore increased net die per wafer (numbers of usable chips produced from a standard semiconductor wafer). To meet these requirements, semiconductor manufacturers have been forced to build new fabrication lines at the next generation process node (gate length). As the critical dimensions for these devices grow smaller, greater difficulties will be experienced in patterning these features using conventional photolithography.

Conventional photolithography methods used for pattern generation involve exposing a light sensitive photoresist layer to a light source. The light from the source is modulated using a reticle, typically a chrome on glass mask. The patterns formed on the reticle are transferred to the photoresist layer using typically visible or ultraviolet light. The areas so exposed are then developed (for positive photoresist) or, alternatively, the shaded areas are developed for negative type photoresist. The developed regions are then washed away and the remaining photoresist pattern used to provide an etching mask for the substrate.

Unfortunately, the mask or reticle is extremely expensive. Often these costs are disproportionate to the costs involved in other aspects of the chip fabrication. This is particularly the case when the chip is an application specific integrated device with only a small production lot desired. Moreover, often the design of the chip must be modified after testing of chips produced from the first mask. This results in additional expenditures for second, third, and even more sets of masks. Finally, with the reduction in feature sizes, various process limitations in the conventional lithography process have made IC fabrication more difficult.

X-ray and electron beam lithography have been proposed (and adopted in some instances) for imaging very small features. This is because the radiation employed in these techniques has much shorter wavelengths than the ultraviolet radiation employed in conventional photolithography. However, x-ray lithography has found only limited acceptance because of mask, source and resist technology problems. Sources have not been sufficiently bright, and resists have not been adequately sensitive or process-resistant. Further, the x-ray mask is complex to manufacture and does not permit resolution consistent with the theoretical limits set by wavelength. For these reasons, x-ray lithography has not gained widespread acceptance.

Electron-beam lithography (referred to herein as e-beam lithography) involves exposure of a radiation sensitive film to a beam of focused electrons in a vacuum, followed by development of the resist film, and subsequent etching. Thus, e-beam lithography includes the basic steps of conventional lithography, but substitutes a scanning electron beam for an ultraviolet source and reticle. Unfortunately, the imaging step of e-beam lithography is relatively slow. Rather than exposing an entire IC to an image in one shot (as is done in conventional optical lithography), e-beam lithography requires that an electron beam be scanned over the IC wafer surface in a rasterized fashion. To produce a thin line, an e-beam sometimes must be scanned over the line multiple times because the beam size is quite small. This combination of raster scanning and multiple passes requires a long time to produce a pattern image. Thus, fabrication processes employing e-beam lithography have relatively low throughput.

Thus, high costs and maintaining the high precision required for sub-wavelength features are paramount problems.

In view of the above, what is needed is a relatively fast and inexpensive method for transferring images of very thin line width to a wafer. In other words, an effective solution to rising mask costs is needed.

SUMMARY OF THE INVENTION

To achieve the foregoing, the present invention provides an optimized direct write lithography system using optical mirrors. Current lithography systems control pattern generation by using chrome on glass masks to control the flux at a specific spot on the photoresist pattern. More particularly, the chrome on glass mask is used to modulate the light flux. That is, the source light directed to the chrome portions of the mask is minimized whereas the flux at exposed locations is at a maximum.

The present invention provides an optimized direct write lithography system using optical mirrors. That is, a maskless lithography system is provided. The maskless direct-write lithography system provided uses an array of mirrors configured to operate in a tilted (torsional) mode, a piston-displacement mode, or both in combination. The controlled mirror array is used as a substitute for the traditional chrome on glass mask. In order to avoid constraining the system to forming edges of patterns aligned with the array of mirrors, gray-scale techniques are used for subpixel feature placement. The direct-writing of a pattern may rely on a single mirror mode or a combination of modes. By using the proposed inventive system, light from a source may be modulated in both phase and magnitude to suit the desired pattern. The maskless lithography provided by the embodiments of the present invention reduce the costs for design iterations. Hence, the incremental costs of a design iteration are minimized.

According to one embodiment, a method of forming a pattern on a semiconductor wafer includes modulating light directed to a first portion of a photosensitive layer using a plurality of tilted mirrors in a mirror array. Light directed to a second portion of a photosensitive layer is also modulated using a plurality of piston mirrors in the mirror array, the plurality of piston mirrors configured such that the displacement of the mirrors from a neutral plane of the mirror array creates varying degrees of interference of light waves on the image, the amount of interference corresponding to the degree of displacement. In accordance with one aspect, wherein the tilted mirrors are controlled such that at least two adjacent mirrors generate a phase difference of about 520 degrees on a predetermined portion of the photosensitive layer.

These and other features and advantages of the present invention are described below with reference to the drawings.

BRIEF DESCRIPTION OF THE DRAWINGS

FIG. 1 is a schematic diagram illustrating an optical direct write system in accordance with one embodiment of the present invention.

FIG. 2 is a schematic diagram illustrating a raster pattern for scanning a wafer using the system illustrated in FIG. 1.

FIG. 3 is a schematic diagram illustrating the mirror array of FIG. 1 arranged in a neutral position.

FIG. 4 is a schematic diagram illustrating the mirror array of FIG. 1 arranged with adjacent mirrors in a tilted configuration, in accordance with one embodiment of the present invention.

FIG. 5 is a schematic diagram illustrating the mirror array of FIG. 1 arranged with adjacent mirrors displaced in a direction normal to the plane of the mirror array, in accordance with one embodiment of the present invention.

FIG. 6 is a schematic diagram illustrating the mirror array of FIG. 1 arranged with adjacent mirrors in a second tilted configuration, in accordance with one embodiment of the present invention.

FIG. 7 is a schematic diagram illustrating the mirror array of FIG. 1 arranged with adjacent mirrors in a second configuration, the mirrors displaced in a direction normal to the plane of the mirror array, in accordance with one embodiment of the present invention.

FIG. 8 is a flow chart illustrating operations in performing direct write optical lithography using mirror arrays, in accordance with one embodiment of the present invention.

FIGS. 9A and 9B are plots illustrating the image quality generated using various configurations of the mirror array, in accordance with embodiments of the present invention.

FIGS. 10A-10C are plots illustrating the image quality generated from the mirror array when individual mirrors are both displaced and tilted, in accordance with one embodiment of the present invention.

FIGS. 11A-11C are plots illustrating the image quality generated using various configurations of the mirror array wherein individual mirrors are both displaced and tilted, in accordance with embodiments of the present invention.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides an optimized direct write lithography system using optical mirrors. That is, a maskless lithography system is provided. The maskless direct-write lithography system provided uses an array of mirrors configured to operate in a torsional (i.e., tilted) mode, a piston-displacement ("piston") mode, or both in combination. A scanning apparatus is provided that uses the mirror array to reflect light onto either a wafer or a reticle covered with a photoresist layer. In order to avoid constraining the system to forming edges of patterns aligned with the array of mirrors, gray-scale techniques are used for subpixel feature placement. The direct-writing of a pattern may rely on a single mirror mode or a combination of modes. By using the proposed inventive system, light from a source may be modulated by combining the phases from adjacent mirrors in a customized fashion for the desired pattern. The individual mirrors are controlled to implement the above-referenced gray scale techniques.

Tilting mirrors are used in current systems to introduce a light path difference (i.e., across the mirrors) resulting in a phase difference that enhances contrast. The present invention enhances the phase difference by changing the design. In specific, a combination of fixed piston driven mirrors and tilted mirrors are used to control the light flux on the photosensitive layer. The techniques and systems of the embodiments of the present invention may be used, for example, to directly form patterns on photoresist layers such as those deposited on wafers. In addition, the pattern generation techniques disclosed may extend to other applications, for example including, the exposure of photosensitive resist layers on reticle substrates (e.g., glass) in order to form the reticle patterns.

FIG. 1 is a schematic diagram illustrating an optical direct write system in accordance with one embodiment of the present invention. The system 100 relies on the mirror array 102 to modulate the light flux from the illumination source 108. The illumination source 108 may be any illumination source capable of generating electromagnetic waves sufficient to reflect from the mirror array 102 and to induce chemical changes in a photosensitive layer on the wafer 104. Preferably the light source is an intermittent source, capable of exposing the wafer during selected periods of a continuous scan movement of the light beam relative to the wafer. Further details as to the mirror array 102 will be provided later in this description. Preferably, each of the individual mirrors in the mirror array is responsive to control signals provided at each point in a scan of a wafer. The light 109 from the illumination source may be directed to the photosensitive wafer by any suitable means as known to those of skill in the relevant art. In accordance with one embodiment, the mirror array comprises a plurality of mirrors, each of the plurality of mirrors having a very small size. For example, simulations were run using square mirrors having sides of length 37.5 nm, such mirrors placed at 40 nm spacings. Preferably, each of the plurality of mirrors corresponds to a pixel imaged on the wafer. Although the apparatus illustrated is a catioptric configuration, the scope of the invention is not so limited. That is, any configuration which allows the use of mirror arrays to direct light to a substrate is expected to be suitable an thus within the scope of the invention.

FIG. 2 is a schematic diagram illustrating a raster pattern for scanning a wafer using the system illustrated in FIG. 1. The scanning system is configured to preferably scan the wafer by suitable movement of the stage 106 illustrated in FIG. 1. Preferably the scan is a continuous movement with the exposure for each pixel position occurring within a short time period. Thus, due to the short duration of the source light, despite the continuous movement of the stage mounted wafer, the light is effectively a flash exposure and exposes the photosensitive layer on the wafer 200 in only those selected areas of the wafer corresponding to the current configuration of the mirror array. The raster pattern 204 illustrated in FIG. 2 results from the control of the stage movement and control of the light source. It is to be appreciated that any suitable light source capable of providing light in intermittent periods will be suitable. Suitable sources are known to those of skill in the relevant art and include intermittent sources such as excimer lasers as well as continuous sources operated in conjunction with a shutter or blanker.

The mirror array 102 illustrated in FIG. 1 preferably comprises a plurality of mirrors, the individual mirrors preferably capable of operating in a tilting mode, a piston mode, or a combination of the two modes. In the tilting mode, each individual mirror is controlled by electrostatic voltages applied to electrodes to control the degree of tilt in an analog fashion. The actual tilting of the individual mirror may be constrained to several degrees of movement in either direction from the neutral "flat" position by the physical configuration of the mirrors and the mirror array. However, even this limited movement is sufficient to alter the phase of the mirrors such that adjacent mirrors can be configured to provide controlled interference and accordingly vary the amount of light reaching the photosensitive region of the wafer. This results in enhanced contrast. It should be noted that for illustrative purposes the configuration and use of the mirror array are described in the context of a system applying a pattern to a photosensitive region of the wafer. However, the invention scope is not so limited. The scope of the invention is intended to extend to transfer of patterns to any photosensitive layer, for example to include the formation of patterns on photo masks or reticles.

Structures and operational use of tilted and mirror arrays are known in the art and thus further detail here is deemed unnecessary. For example, the use of piston and tilted mirrors is described in "Optical Analysis of Mirror-Based Pattern Generation" by Y. Shroff, Yijian Chen, and W. G. Oldham; Proceedings of SPIE, Vol. 5037 (2003), the entire disclosure of which is incorporated herein by reference for all purposes.

As a further example, integrated circuits comprising microelectronic mirror devices are available commercially. For example, Texas instruments, Inc. of Dallas, Tex. produces a Digital Micromirror Device (DMD) comprising an array of microscopically small square mirrors, each mirror corresponding to a pixel in the projected image. The individual micromirrors are hinged, allowing rotation on a diagonal axis, approximately +/−10 degrees from a neutral position.

Although in one embodiment the direct-writing of the wafer is performed in one pass, a preferred embodiment uses 2 or more passes to average the values. That is, multiple passes provide better control of dose and corrections for asymmetry in the image and correction for image placement error.

FIG. 3 is a schematic diagram illustrating the mirror array 102 of FIG. 1 arranged in a neutral position, in accordance with one embodiment of the present invention. That is, the mirror array 300 illustrates one configuration of individual mirrors 302. The mirror array 300 is suitable for placement in the pattern transfer system 100 illustrated in FIG. 1, for example in lieu of mirror array 102. The individual mirrors 302 are shown in a coplanar position with the plane of the mirror array 300, thus reflecting incident light back in a direction normal to the plane of the individual mirrors 302 (as well as the plane of the mirror array 300). In this particular configuration, the incident light is reflected and directed to the corresponding pixel of the wafer 104. Accordingly, with the use of a negative photoresist layer on the wafer 104, the exposed region will be converted and left in place (on the photoresist layer) for subsequent etching operations. It is to be understood that this neutral position may be achieved by supplying suitable electrostatic potentials to electrodes corresponding to the individual mirrors as known to those of skill in the relevant arts. In contrast, in order to form a trench in the wafer, the mirrors require an adjustment (in tilt) such that an absence of light appears on the selected portion of the photosensitive resist on the wafer, thus allowing the resist in the selected area to subsequently be dissolved followed by etching using the patterned resist layer. Generally, dark areas correspond to complete interference (tilting).

The present invention, in various embodiments, may be configured to direct light to a substrate such as a wafer by tilting the mirrors, arranging the individual mirrors in piston-displaced positions, or for optimal contrast according to yet another embodiment configuring the individual mirrors to have both tilt and piston displacement. Each of the FIGS. 4-7 illustrate example configurations for the mirror array in order to introduce phase differences into the direct write printing process and thus to effectuate printing of features. While illustrative, these configurations are not intended to limit the scope of the present invention. FIG. 4 is a schematic diagram illustrating the mirror array of FIG. 1 arranged with adjacent mirrors in a tilted configuration, in accordance with one embodiment of the present invention. Specifically, this diagram illustrates the mirror array 400 having an alternating row tilt configuration. Preferably, the individual mirrors are configured to operate in a plurality of positions, each of the positions or states corresponding to a different angular rotation of the mirror. That is, a variable voltage may be applied to the electrodes to operate the mirror in an analog mode. Moreover, it is preferable that the spaces between mirrors is small in comparison to the surface area of the mirrors.

More specifically, mirrors 412 and 422 are shown tilted in a first direction, the direction depicted by vectors 451 and 453. The second row of mirrors, i.e., mirrors 414 and 424, are shown tilted in a second direction, opposite to that of the first direction. It is understood that in accordance with embodiments of the present invention, each of tilting or vertically displaced individual mirrors operate to alter the phase of the light impinging on the mirrors when combined with light impinging on adjacent mirrors. For the tilted mirror configuration, the tilting introduces an optical path difference across the mirrors that enhance contrast. The optical path difference results in an interference effect due to the phase difference of the light. In the alternating row tilt configuration shown, the phase varies with the distance from the axis of rotation of the mirror. For instance, the phase of the light beam striking the raised edge portion 461 of mirror 412 is advance relative to the phase at the center of rotation 460 (i.e., at the center of the mirror)) and even more advanced relative to the phase at the lowered edge 462. In the alternating row, i.e., the row including mirrors 404, 414, 424, and 434 the tilted mirrors 414 and 424 are tilted in the second direction. This results in impinging light beams reflected in directions 455 and 457. Assuming that each mirror in the mirror array corresponds to a pixel on the image (e.g., the wafer), for the tilted configuration, the degree of phase difference achievable depends on the tilt of the mirror and the tilt of the adjacent mirrors. For example, the phase difference of light waves reflected from different portions of the individual mirror may vary from 260 degrees at edge 461 to 0 degrees at the axis of rotation 460 to −260 degrees at edge 462. Given that mirror 422 is aligned in a similar direction, the phase difference between light reflected at the upper edge 461 of mirror 412 and the lower edge 465 of mirror 422 is enhanced. This configuration provides optimal results for 1 pass processes.

FIG. 5 is a schematic diagram illustrating the mirror array of FIG. 1 arranged with adjacent mirrors displaced in a direction normal to the plane of the mirror array, i.e., in a piston mode, in accordance with one embodiment of the present invention. That is, the mirror array is configured with piston-type individual mirrors. More specifically, FIG. 5 illustrates an alternating row piston mirror array. That is, mirrors 512, 516, 524, and 528 are shown with the mirrors displaced in a vertical direction from the neutral position, i.e., the position shown by mirrors 502, 504, 506, 508, 532, 534, 536, and 538. In turn, mirrors 514, 518, 522, and 526 are shown with the mirrors displaced at a level below the neutral position. This configuration yields phase differences between adjacent pixels similar to that shown by the alternating row tilt array described above.

FIG. 6 is a schematic diagram illustrating the mirror array of FIG. 1 arranged with adjacent mirrors in a second tilted configuration, in accordance with one embodiment of the present invention. This is an example of a mirror array 600 having the same column tilt. That is, mirrors 602-608 and 632-638 are shown with the mirrors in a neutral position. The adjacent columns, i.e., the column containing mirrors 612-618 and the column containing mirrors 622-628 are both tilted in the same direction. Such a configuration results in telecentricity errors, i.e., an offset of the printing of the feature from a desired position that will require compensation in the form of exposing the substrate in multiple passes. A similar arrangement, but using mirrors with piston-type displacement, is shown in FIG. 7. There, mirrors 702-708 and 732-738 are in a neutral position. The second column containing mirrors 712-718 and the third column containing mirrors 724-728 are each displaced from the neutral position. In particular, the mirrors in the second column are displaced above the neutral position and the mirrors in the third column are displaced below the neutral position.

The mirrors arranged to provide optical path differences using piston displacement as well as the tilted mirror arrays provide advantages over conventional chrome on glass lithography masks. For example, the titled mirror arrangement alone provides enhanced contrast. This results in larger process windows or enhanced resolution.

As a further example, the mirrors with a piston type displacement are well suited to providing accurate pattern transfer. Thus, according to one embodiment of the present invention, the reconfigurable mirror array can be customized for the generation of the optimal characteristics in the pattern transfer. For example, the formation of fine details in portions of the wafer can be achieved using mirrors in a tilted configuration. In contrast, the piston-type arrangement is especially well suited for the formation of resolution enhancement features, and hence the mirror array can be configured to expose the wafer using mirrors in a piston mode during the appropriate portion of the scan. Resolution enhancement features such as optical proximity correction (OPC) are typically used to make patterned lines of the circuit on the printed wafer less sensitive to changes in lithographic process parameters such as focus and dosage. This increases the process window. Thus, resolution enhancement features such as might appear typically as serifs or hammerheads on the glass mask can be mimicked using the mirror array in a piston type displacement configuration. Accordingly, in accordance with one embodiment of the present invention, during the course of the scan of the wafer the individual mirrors are reconfigured in a tilt arrangement, a piston arrangement, or a combination of the two.

Suitable mechanism for providing both tilting and mirror displacement functions have been described in the art, for example using a hinge positioned on one side of the individual mirror. For example, in one device the dual purpose array is constructed by using a hinge on the face of the piston mirror, the tilting and the deflection (displacement) is controlled by electrostatic forces. Beneath the piston are ribbons for controlling electrostatic movement. Suitable mirrors for use in semiconductor patterning applications are expected to be in the range from 1 to 16 microns, more preferably 1 to 4 microns. Individual mirrors having both tilt and piston displacement are shown in diagrammatic form in FIGS. 10A-10C and 11A-11C. In preferred embodiments, mirrors are configured with both tilt and piston displacement for their enhanced contrast performance as described further below.

FIG. 8 is a flow chart illustrating operations in performing direct write optical lithography using mirror arrays, in accordance with one embodiment of the present invention. The process commences in operation 802 with the configuration of the array. The individual mirrors in the array are capable of configuration as either tilt mirrors or piston mirrors. Thus, in accordance with one embodiment, a portion of the array includes mirrors configurable in a tilted arrangement and another portion of the array includes mirrors configurable in a piston displacement method. For example, the titled mirror portion may be located in line with the piston displacement mirrors. By appropriately controlling the array and the stage, in a one-pass operation, the selected features of the pattern may be created using the tilted mirror portion and other features created using the piston displacement mirrors of the array. With the mirrors in the array in a piston mode, the array can be controlled to generate significant amounts of interference.

In accordance with another alternative embodiment, each of the inidvidual mirrors can be configured to operate in either the tilted mode or the piston displacement mode. This arrangement is more suitable for multiple pass operations.

In accordance with yet another embodiment, each of the mirrors can be configured to operate in either the tilted mode or the piston displacement mode or both. That is, in a preferred embodiment, tilting and piston displacement methods are simultaneously performed for enhanced contrast. The selection of each mode may be a function of the presence of sub resolution assist features as well as the presence of features having small critical dimensions.

Mirrors altering the phase of the impinging light using both a tilt and a displaced mirror have shown to have higher signal to noise ratios (aerial SNR's). The aerial standing wave ratio ("aerial SWR") is defined for the image formed on the wafer as the (max−min)/(max+min)×100. That is, the aerial SWR is a measure of the contrast at the wafer level. Higher values result in increased resolution and larger process windows.

Next, in operation 804, the sample (e.g., wafer) is illuminated using the configured array. Preferably a continuous scan is performed with the exposure for each configuration of the array occurring during a short interval of the entire interval that the wafer is aligned with the corresponding mirror array.

If the scan is not completed as determined in operation 806, the process flow is directed to operation 810 where the array is reconfigured for the next exposure, with the illumination occurring after reconfiguration. The process of reconfiguring the array (810) and illuminating the array (804) continues until a determination is made in operation 806 that the scan is complete. Once the scan is completed, the process ends at operation 812. Accordingly, during a typical raster scan (as illustrated in FIG. 2, the mirror array will be configured thousands of times, the precise amount of reconfigurations depending on the size of the wafer, the size of the wafer features, the size of the mirror array, and the number of passes. Multiple passes provide advantages in greater dose control and correction for image placement errors.

Experimental Results:

In order to compare the performance of configurations representative of several different embodiments, simulations were run using a combination of fixed piston-drive mirrors and tilted mirrors. Simulations were run on a commercial simulation tool, specifically the PROLITH tool manufactured and sold by KLA-Tencor of San Jose, Calif. Other comparable products are available to simulate variations in critical dimensions caused by changes in process parameters. The light flux impinging on the pixels (of the wafers) was evaluated using an aerial image intensity measure or a normalized image log slope (NILS) measure. The former parameter provides a normalized assessment of the light flux, the normalization taken relative to maximum reflectivity or complete transmission. NILS provides a better measure of the effect of the mirror configurations on the process window, especially when plotted against focus changes.

FIGS. 9A and 9B are plots illustrating the image quality generated using various configurations of the mirror array, in accordance with embodiments of the present invention. It should be noted in general that in these 2 figures as well as in FIGS. 10A-10C and 11A-11C, the mirror cartoons in each of the graphs do not necessarily correspond with the graph's x-axis. That is, the mirrors are each 40 nm wide at the wafer plane so that the cartoons display a line width of 80 nm (2 mirrors) with a 160 nm space (4 mirrors). Thus, the mirror cartoons in each example represent a wafer level scale of −120 to +120 nm.

In particular, FIG. 9A illustrates a graphical diagram showing the aerial image SWR as a percent as a function of the phase range (in degrees). Adjacent rows of mirrors as shown in the mirror cartoon 904 employ mirrors in an alternating row tilted configuration. The plotted curve 902 produces a maximum SWR, i.e., a maximum contrast at a tilt range of 520 degrees. This corresponds to each of two adjacent mirrors producing about 260 degrees of phase difference, with the first mirror generating the phase difference of 260 degrees in a direction opposite to the phase difference generated by the second mirror. Thus, the total phase difference from the opposite phases is about 520 degrees and generates a max SWR. A preferable working range for the phase difference lies in the range of 400-600 degrees, more preferably 480-520 degrees. The 4 mirrors (2 in row 1 and 2 in row 2) tilt the same amount. The top row (row 1) tilts to the right, the bottom row tilts to the left. This pattern repeats to infinity to simulate a long line (optically that is >1 um long). Row 3 (not shown) tilts to the right. Row 4 (not shown) tilts to the left, and so on to infinity. The feature dimensions are 80 nm line with 160 nm space for a 240 nm pitch. The highest contrast is the best operating point.

FIG. 9B plots piston mirror SWR as a function of phase difference and shows a maximum contrast at about 280 degrees, with the SWR value being about 50 percent. Again, all the 4 moving mirrors move the same amount and the higher the contrast, the better. Like FIG. 9A, the mirror pattern is a 80 nm line (40 nm mirrors) with 160 nm space and repeats for ever. This illustrates that the piston type displacement configuration generates higher SWR's than similar tilt type arrangements.

FIGS. 10A-10C are plots illustrating the image quality generated from the mirror array wherein individual mirrors are both piston-displaced and tilted, in accordance with embodiments of the present invention. In each of the FIGS. 10A-10C, the mirror configuration (depicted by mirror cartoons) is identical, i.e., alternate row tilt and 180 degree displaced piston mirror.

FIG. 10A represents a tilt+piston mirror configuration, and plots the aerial image intensity as a function of distance across the wafer. Since pitch is 240 nm, the pattern repeats in y as a sin wave of x (y is proportional to sin(x)) where the piston part is fixed at 180 degrees and the tilt portion is varied from 0 to 240 degrees (0, 60, 120, 180, and 240 degrees are plotted). Maximum contrast occurs at tilt=180 degrees. FIG. 10B in turn, illustrates a tilt+piston configuration, with the SWR calculated from FIG. 10a vs tilt phase range. As stated earlier, SWR=[(max−min)/(max+min)] where max=aerial image intensity at an x distance of + or −120 nm, and min=aerial image intensity at x=0 nm distance. The maximum SWR is essentially 180 degrees tilt where the piston phase difference was set at a constant 180 degrees.

FIG. 10C illustrates a tilt+piston NILS as a function of focus for various tilt ranges (0, 60, 120, 180, 240 degrees) s. The NILS is maximum at all focus values at a tilt range of 180 degrees (on top of 180 degree piston).

FIGS. 11A-11C are plots illustrating the image quality generated using various configurations of the mirror array wherein individual mirrors are both displaced and tilted, in accordance with embodiments of the present invention. FIG. 11A illustrates a tilt+piston mirror aerial image intensity like FIG. 10A but this time the piston phase varies such that piston=tilt. FIG. 11B illustrates tilt+piston SWR (similar to FIG. 10B) but this time the piston phase varies such that piston=tilt. FIG. 11C illustrates tilt+piston SWR but this time the piston phase varies such that piston=tilt.

By combining the tilted mirrors and the fixed piston mirrors the contrast has been enhanced and accordingly the process window enlarged. Moreover, by combining tilting and piston type displacement for an individual mirror in the array, improved resolution results. Accordingly, the present invention, in accordance with one embodiment, replaces a standard reticle with a programmable mirror array system configured to control the tilting and lateral position of the mirrors in order to control the flux to the wafer. The direct-write mirror configuration as described provides increased resolution while maintaining compatibility with existing scanning platforms. Further, the system is easily adapted to new patterns or to design iterations for existing masks.

This invention is particularly advantageous in low volume patterning applications. That is, for production runs requiring relatively few chips, for example, prototype runs, maskless lithography helps reduce costs by eliminating the capital costs of the expensive reticles. The present invention provides an array of micromirrors that are reconfigurable or programmable and provides enhanced contrast. The maskless direct write system can be used or adapted to form any pattern without incurring the high capital outlays for numerous reticles.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming a pattern on a reticle substrate, the method comprising:

modulating light directed to a first portion of a photosensitive layer using a plurality of tilted mirrors in a mirror array wherein each of the tilted mirrors are included as part of a piston displacement element so that a combination of tilting of the mirrors and a relative displacement of the mirrors combine to create varying degrees of interference of light waves on an image, the amount of interference corresponding to a combination of a degree of tilting and a degree of displacement; and modulating light directed to a second portion of a photosensitive layer using the plurality of tilted mirrors in the mirror array wherein each of the tilted mirrors are included as part of the piston displacement element so that the combination of tilting of the mirrors and the relative displacement of the mirrors combine to create varying degrees of interference of light waves on the image, the amount of interference corresponding to a combination of the degree of tilting and the degree of displacement.

2. The method of forming a pattern on a reticle substrate as recited in claim 1, wherein the mirrors are controlled such that at least two adjacent mirrors generate a phase difference of about 520 degrees on a predetermined portion of the photosensitive layer.

3. The method of forming a pattern on a reticle substrate as recited in claim 1, wherein the individual mirrors are used to write a first feature of the pattern and wherein at least one of the mirrors are used to write a second feature of the pattern.

4. The method of forming a pattern on a reticle substrate as recited in claim 1, wherein a piston component of the mirrors is configured such that two adjacent mirrors exhibit about 180 degrees in phase difference.

* * * * *